(12) United States Patent
Wu

(10) Patent No.: US 6,218,289 B1
(45) Date of Patent: Apr. 17, 2001

(54) METHOD FOR CONTACT ANNEAL IN A DOPED DIELECTRIC LAYER WITHOUT DOPANT DIFFUSION PROBLEM

(75) Inventor: Kuo-Chang Wu, Taichung (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/241,960

(22) Filed: Feb. 2, 1999

Related U.S. Application Data

(63) Continuation of application No. 08/720,191, filed on Sep. 25, 1996, now abandoned.

(51) Int. Cl.$^7$ .............................................. H01L 21/4763
(52) U.S. Cl. ......................... 438/632; 438/624; 438/783
(58) Field of Search .................................. 438/783, 624, 438/626, 632, 760

(56) References Cited

U.S. PATENT DOCUMENTS 5,284,800 * 2/1994 Lien et al. .
5,492,868 * 2/1996 Lin et al. .
5,554,565 * 9/1996 Liaw et al. .

FOREIGN PATENT DOCUMENTS

08330252 * 12/1996 (JP) .

OTHER PUBLICATIONS

K. D. Stonnington, et al "Synthesis and characterization of SiO2 films deposited using TEOS" J. Vac. Sci. & Tech. A, vol. 10, No. 4, pt. 1, p. 970–3, Jul., 1992.*

* cited by examiner

Primary Examiner—Caridad Everhart
(74) Attorney, Agent, or Firm—Tung & Associates

(57) ABSTRACT

A method for annealing a contact in a doped dielectric layer without the occurrence of dopant diffusion problem by depositing a sacrificial barrier layer of oxide material in the contact opening which is capable of preventing diffusion of dopant ions into the contact opening during a high temperature reflow process for the doped dielectric layer and followed by a deposition of an electrically conductive metal into the contact opening.

14 Claims, 2 Drawing Sheets

METHOD FOR CONTACT ANNEAL IN A DOPED DIELECTRIC LAYER WITHOUT DOPANT DIFFUSION PROBLEM

This is a continuation of application Ser. No. 08/720,191 filed on Sep. 25, 1996 now abandoned.

FIELD OF THE INVENTION

The present invention generally relates to a method for contact anneal in a semiconductor device and more particularly, relates to a method for contact anneal in a doped dielectric layer without the occurrence of dopant diffusion problems.

BACKGROUND OF THE INVENTION

In modem semiconductor devices built on a silicon substrate, P+ and N+ type doped regions in the silicon substrate are the basic elements of the device that must be connected in a specific configuration to form a desired circuit. The circuit must also be accessible to the outside world through conducting pads for testing and for bonding to metal pins in a packaged chip. In such a circuit, at least one low resistance metal layer must be deposited and patterned to form contacts and interconnects between the different regions on the chip. A variety of metal and metal alloys can be used for this purpose with aluminum as the most widely used contact and interconnect material due to its high conductivity, low cost, and compatibility with silicon.

In a typical metalization process, a wafer is first covered with an insulator layer, patterned and etched for contact openings in the insulator, and then metal such as aluminum is deposited and defined to form contact plugs and interconnecting leads. In modem sub-micron semiconductor technology, as the minimum feature size is reduced and the device dimensions continue to shrink, the reduced depth of a junction (i.e., a contact plug) results in an inevitable increase in the contact resistance of the junction. When an electrical contact is made between two dissimilar materials, a contact potential caused by a resistance typically develops at the interface between the two materials. The term contact resistance $R_c$ (in units of $\Omega\text{-cm}^2$) defines the average resistance across the interface between two dissimilar materials that are in contact. While surface dopant concentration should be sufficiently high such that a sufficiently low contact resistance can be achieved in a sub-micron contact, the dopant concentration at the interface should be constant so that a reliable and consistent contact resistance can be determined.

The insulator material, in which the contact or interconnect is formed, is usually a dielectric material that has a dielectric constant that approaches unity. The dielectric layer is sometimes referred to as an inter-layer dielectric (ILD) or a poly-metal dielectric (PMD). A dielectric material can be deposited, planarized, and patterned to define openings for contacts to silicon and polysilicon. A typical dielectric composition suitable for forming contacts therein consists of a thick (i.e., 5,000~10,000 Å) film of silicate glass such as a phospho-silicate glass (PSG) or a boro-phospho-silicate glass (BPSG). These materials can be densified and reflowed at a temperature above their glass transition temperatures, for instance, at a temperature between about 700° C. and about 900° C. Dopant ions are typically added to silicate glass to reduce their reflow temperatures. For instance, PSG is normally doped with phosphine or trimethyphosphate, while BPSG is normally doped with trimethylborate. The reflow of the dielectric layer is necessary such that the glass material conformably covers steps, fills gaps between various device lines and achieves a more planar surface. For devices at more reduced dimensions, i.e., at the sub-0.5 micron level, the reflow process for the glass may not be adequate and instead, a chemical-mechanical polishing (CMP) method may be used.

In a contact opening formed in a doped silicate glass dielectric layer, the contact surface is highly susceptible to dopant contamination occurring at high temperatures such as that required to reflow the dielectric material. Contamination by dopant ions such as those of boron or phosphorus evaporated out of a BPSG dielectric layer can lead to an instability in contact resistance. Such instability in the contact resistance in turn leads to various reliability problems in the semiconductor device.

It is therefore an object of the present invention to provide a method for contact anneal in a doped dielectric layer that does not have the drawbacks and shortcomings of conventional contact annealing methods.

It is another object of the present invention to provide a method for contact anneal in a doped dielectric layer without the occurrence of a dopant diffusion problem and the resulting instability in the contact resistance.

It is a further object of the present invention to provide a method for contact anneal in a doped dielectric layer by providing a cap layer of oxide in the contact opening prior to the contact annealing step for blocking dopant ion diffusion.

It is still another object of the present invention to provide a method for annealing a contact in a doped dielectric layer by providing a cap layer of oxide that has a thickness sufficient to block dopant ion diffusion.

It is still another object of the present invention to provide a method for annealing a contact in a doped dielectric layer by providing a cap layer of oxide in the contact that is sufficiently thick capable of blocking dopant ion diffusion and yet is sufficiently thin so as not to impede the reflow of the dielectric layer in forming a contact opening having a rounded corner.

It is yet another object of the present invention to provide a method for contact anneal in a doped dielectric layer by providing a cap layer of oxide in the contact prior to the annealing step such that a rounded shoulder area in the contact opening is formed after the reflow process to facilitate a subsequent aluminum sputtering process.

SUMMARY OF THE INVENTION

The present invention provides a method for contact anneal in a doped dielectric layer without the occurrence of dopant diffusion problem by providing a cap layer of a dielectric material capable of stopping diffusion of dopant ions into the contact wherein the dielectric material layer is thick enough to stop dopant diffusion and yet thin enough to allow the reflow of the doped dielectric layer.

In a preferred embodiment, a method for annealing a contact in a doped dielectric layer can be carried out by first providing a semi-conducting substrate, forming a first dielectric layer on the substrate, depositing a second dielectric layer on the first dielectric layer where the second dielectric layer contains at least one type of dopant ion and is substantially thicker than the first dielectric layer, opening a contact in the first and the second dielectric layers, depositing a cap layer of a third dielectric material capable of stopping diffusion of dopant ions into the contact, and annealing the contact at a temperature sufficient to reflow the second dielectric layer. The thickness of the cap layer is between about 50 Å and about 600 Å, and preferably, between about 100 Å and about 300 Å. The doped dielectric layer is normally formed of a phospho-silicate glass (PSG) or a boro-phospho-silicate glass (BPSG) material that can be reflowed at a temperature between about 700° C. and about 900° C. The cap layer is preferably a plasma enhanced TEOS-ozone oxide material.

The present invention is also directed to an electronic structure that includes a semi-conducting substrate, a dielectric layer containing dopant ions and having a thickness sufficient for forming a contact, and an electrically conductive metal filling the contact wherein the contact was covered by a sacrificial oxide layer during a reflow process for the dielectric layer so as to prevent diffusion of dopant ions into the contact and the oxide layer was subsequently removed prior to the filling of the contact by a conducting metal.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention provides a method for contact anneal in a doped dielectric layer without the occurrence of a dopant diffusion problem which can be carried out by first depositing a cap layer of a dielectric material such as oxide capable of stopping diffusion of dopant ions into the contact and then annealing the contact at a temperature sufficient to reflow the doped dielectric layer.

The reflow process for the dielectric layer not only reduces the surface topography, but also serves other purposes. For instance, during a reflow process conducted at a relatively high temperature of between 700° C.~900° C. the high temperature effectively anneals the semiconductor device which included the silicon substrate to repair damages in the crystal structure incurred during previous fabrication steps. The reflow process for the dielectric layer therefore provides the additional benefit of annealing the silicon substrate such that defects are repaired and a more reliable semiconductor device can be obtained.

During the reflow process of the dielectric layer, a more rounded and tapered opening of the contact is also achieved in the dielectric layer. The rounded corner at the contact opening enables easier filling by metal particles into the contact in an aluminum sputtering process. The aluminum sputtering process is a popular and widely used technique in depositing aluminum in contact openings for contact filling due to its high deposition rate and high throughput. A rounded corner at the contact opening allows improved floor coverage resulting in more uniform deposition thickness. This is in contrast to a sharp corner in a contact hole opening which frequently results in incomplete contact filling and void formation.

Figure 1:
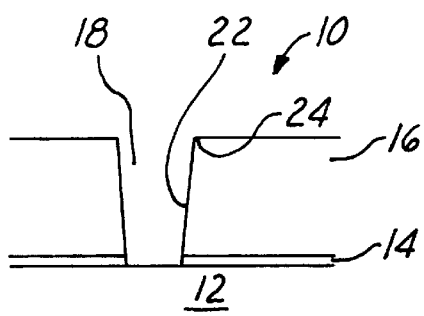
FIG. 1 is an enlarged, cross-sectional view of a contact opening formed in a doped dielectric layer.

Referring initially to FIG. 1, where a semiconductor structure 10 built on a silicon substrate 12 is shown. To arrive at the structure 10 shown in FIG. 1, onto a silicon substrate 12 a thin TEOS oxide layer 14 is first deposited for use as a barrier layer for preventing dopant ion diffusion between a subsequently deposited doped dielectric layer 16 and the silicon substrate 12. The thickness of the thin TEOS oxide layer 14 is between approximately 50~150 Å while the thickness for the dielectric layer 16 is between approximately 5,000 Å and 10,000 Å.

The dielectric layer 16 is deposited of a doped dielectric material such as boro-phospho-silicate glass (BPSG) or phospho-silicate glass (PSG) by a chemical vapor deposition technique. The PSG is typically doped with phosphine ($PH_3$) or trimethylphosphate (TMP), while BPSG is normally doped with trimethylborate (TMP). The function of the dopant ions is to reduce the reflow temperature required for the dielectric layer to a temperature range of between about 700° C. and about 900° C. The reflow or planarization process is required so that the surface topography of the dielectric layer can be reduced.

The TEOS oxide layer 14 can be formed by the pyrolysis of TEOS into an oxide film similar to a decomposition process of silane into polysilicon. A carrier gas, typically an inert gas such as nitrogen, is bubbled through liquid TEOS to provide a gas mixture of controlled TEOS partial pressure in the reaction chamber. The molecule of TEOS consists of a silicon atom bonded to four $OC_2H_5$ groups which decomposes at 650° C.~750° C. to produce silicon dioxide and byproducts. A TEOS film deposited by a low pressure chemical vapor deposition technique exhibits superior uniformity and step coverage.

The doped dielectric layer 16 of BPSG and the TEOS oxide layer 14 are then patterned by a photomasking process and etched to form contact opening 18. The etching process produces a contact opening 18 having a substantially vertical wall 22 and a relatively sharp corner section 24 in the shoulder of the opening 18.

During a contact anneal process subsequently conducted, the semiconductor structure 10 is positioned in a furnace and subjected to a high temperature of between about 700° C. and about 900° C. At such temperatures, dopant ions of boron and phosphor frequently diffuse out of a BPSG dielectric layer into the contact opening. A furnace annealing process requires an annealing time between about 5 minutes and about 60 minutes which leads to a dopant ion diffusion problem. When the semiconductor structure 10 is annealed in a rapid thermal process (RTP), the problem of dopant ion diffusion is not as severe since RTP can be carried out in a fraction of the annealing time required in a furnace anneal. Since contact openings are frequently built on P+ or N+ active regions, diffused dopant ions of boron and phosphor severely affect the contact resistance. A high dopant ion concentration at the interface between a metal contact plug and a doped dielectric layer of BPSG leads to a contact resistance that cannot be stabilized and consequently, a poor reliability in the device built.

It has been observed that in a BPSG dielectric layer, boron dopant ions have a more severe effect on P+ active regions which are frequently utilized in memory devices. When a stable contact resistance can not be maintained in a semiconductor device in the P+ and N+ regions, boron and phosphor dopant ions diffused out of a BPSG layer cause reliability problems in a semiconductor device.

Figure 2:
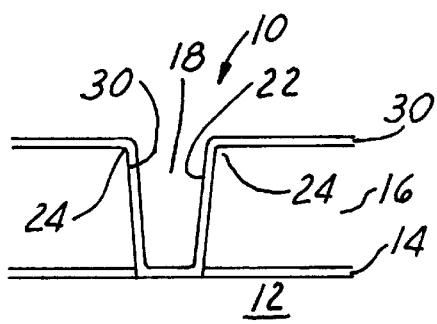
FIG. 2 is an enlarged, cross-sectional view of the contact shown in FIG. 1 coated with a cap layer of oxide.

The present invention novel method for annealing a contact in a doped dielectric layer without the occurrence of dopant diffusion problem is shown in FIGS. 2~7. In FIG. 2, a cap oxide layer 30 is deposited in contact opening 18 by a plasma enhanced TEOS-ozone (PE ozone) process. The PE ozone oxide layer is normally deposited at a low reaction temperature and the film obtained is of a porous nature. Since the cap oxide layer is only used as a temporary, sacrificial layer for preventing dopant ion diffusion from a doped dielectric layer during a reflow process, the layer is deposited by a plasma enhanced chemical vapor deposition method at a temperature as low as 250° C. It should be noted that by sacrificial layer, it is meant that the cap oxide layer serves a temporary purpose and is removed after its function as a barrier layer has been fulfilled.

The contact anneal process can be carried out in a temperature range between about 700° C. and about 1000° C. preferably between about 750° C. and about 950° C. and more preferably between about 800° C. and about 900° C. These temperature ranges are particularly suitable for the reflow process of a doped BPSG dielectric layer. The annealing time required is between about 10 and about 60 minutes, and preferably between about 20 and about 40 minutes. The annealing process should be conducted in an inert atmosphere, such as in nitrogen. Any presence of oxygen should be avoided since oxygen causes other undesirable side effects.

Figure 3:
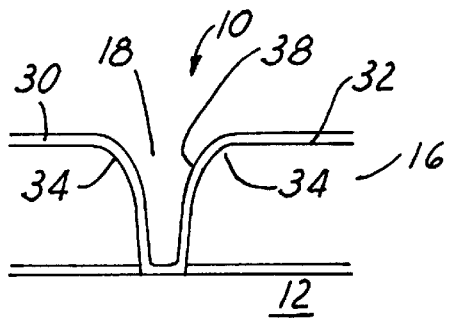
FIG. 3 is an enlarged, cross-sectional view of the contact shown in FIG. 2 after a cap layer of oxide is formed and a reflow process for the doped dielectric layer is conducted.

As shown in FIG. 3, after a reflow process is performed on a BPSG dielectric layer, the surface topography (not shown) is substantially reduced and the top surface 32 of the dielectric layer 16 is substantially planar. Another desirable benefit made possible by the present invention novel method for contact anneal is the achievement of a rounded corner 34 at the shoulder of contact opening 18. The rounded corner 34 at the shoulder of opening 18 is particularly advantageous when contact opening 18 is later filled with aluminum in a sputtering process. The enlarged opening 18 and the sloped side wall 38 allows aluminum particles to fill contact opening 18 more efficiently by first filling the bottom of the opening and thus avoiding the formation of voids at or near the bottom of the contact. A frequently seen defect of incomplete filling in a contact opening which has a sharp corner (shown in FIG. 2) in the shoulder portion of the opening can thus be avoided by the present invention method.

The present invention reflow (or planarization) process for the doped dielectric layer 16 therefore achieves three major purposes. First, the surface topography 32 of the doped dielectric layer 16 can be reduced to achieve a substantially planar surface to facilitate subsequent processing steps. Second, rounded corner 34 can be achieved at the shoulder portion of contact opening 18 such that an aluminum sputtering process can be more efficiently carried out to completely fill contact opening 18 and to eliminate void formation or incomplete fill problems. Thirdly, since the reflow process of the dielectric layer 16 is conducted at a relatively high temperature of between 700° C. and 900° C. for a substantial length of time (such as 30 minutes) in a furnace, the silicon substrate directly under contact opening 18 is annealed to effectively repair damages incurred in previous fabrication steps. This allows a more reliable semiconductor device to be built.

The thickness of the cap oxide layer deposited should be controlled to satisfy two requirements in a contact anneal process without the dopant diffusion problem. First, in order to allow the dielectric layer 16 to flow freely during the reflow process, the thickness of the cap oxide layer must be kept under a maximum value so that the flow of the dielectric layer is not impeded, especially at the corner area of the contact opening. An upper limit for the thickness of the cap oxide layer is approximately 300 Å. The requirement is especially important in a process where the contact opening will be filled by aluminum particles in a sputtering process since a sloped or rounded corner section is very desirable in such process. The second requirement is that the thickness of the cap oxide layer must be large enough such that it will stop dopant ion diffusion. It was discovered that a suitable minimum thickness for stopping boron and phosphor ion diffusion is approximately 50 Å for an oxide layer deposited by a plasma enhanced TEOS-ozone process.

Figure 4:
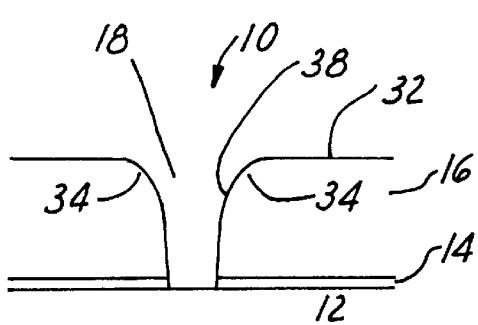
FIG. 4 is an enlarged, cross-sectional view of the contact shown in FIG. 3 after the dielectric reflow process and the removal of the cap layer of oxide.

After the reflow or the planarization process for the doped dielectric layer is carried out, the sacrificial layer of cap oxide 30 can be removed. This is shown in FIG. 4. The cap oxide layer 30 (FIG. 3) is removed in a pre-metal etching process utilizing an isotropic etching technique for removing the cap oxide layer from the contact opening 18. The same pre-metal etching process can be used to remove a native oxide layer if there is no cap oxide layer in the contact opening. The isotropic etching process used is usually a wet etching process capable of effectively removing all unwanted layers.

Figure 5A:
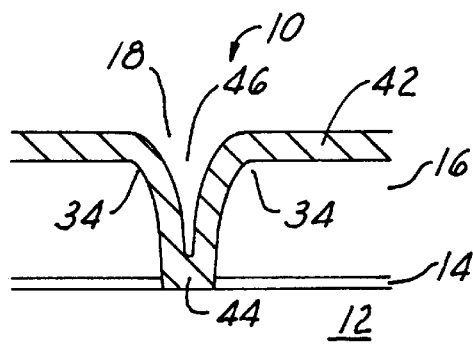
FIG 5A is an enlarged, cross-sectional view of the contact shown in FIG. 4 after reflow and deposited with aluminum by a sputtering method.

In the next step of the process, as shown in FIG. 5A, an aluminum sputtering process is conducted to deposit an aluminum layer 42 into the contact opening 18. The sputtering process for aluminum can be carried out either with a collimator or without a collimator. The use of a collimator restricts the angular divergence of the sputtered aluminum particles and therefore resulting in a more uniform floor coverage. It can be seen in FIG. 5A, the present invention curved shoulder portion 34 in the contact opening 18 also facilitate the aluminum sputtering process such that the bottom 44 of the opening 18 can be completely filled with aluminum without void formation.

Figure 6:
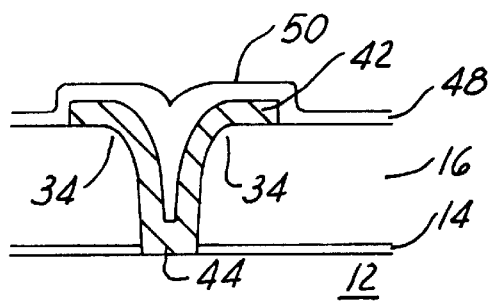
FIG. 6 is an enlarged, cross-sectional view of the contact shown in FIG. 5A having a plasma enhanced oxide layer deposited on top of the aluminum.
Figure 7:
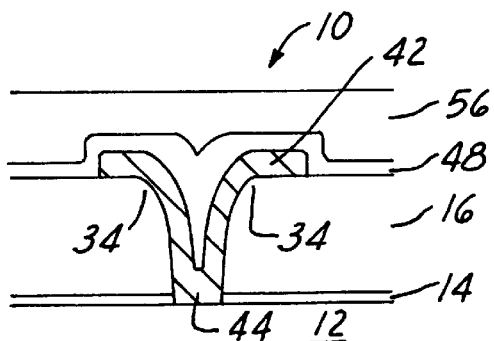
FIG. 7 is an enlarged, cross-sectional view of the contact shown in FIG. 6 having an aluminum layer, a plasma enhanced oxide layer, and a spin-on-glass layer deposited on top.

In the next processing step, a plasma enhanced oxide layer 48 is deposited into gap 46 formed by the aluminum layer 42. This is shown in FIG. 5A. FIG. 6 illustrates that a relatively smooth top surface 50 is obtained after the deposition of the plasma enhanced oxide layer 48, such as in a typical 0.7 micron device. A spin-on glass (SOG) layer 54 is then coated on top of the PE oxide layer 48. The spin-on glass process can be effectively used for gap fill and planarization of inter-level dielectrics in multi-level metalization processes. A most commonly used SOG material is a $SiO_2$ based polysiloxane. A SOG film is typically applied to a pre-deposited oxide (such as the plasma enhanced oxide layer 48) in a liquid form that fills gaps and steps on a substrate. The liquid SOG material is dispensed on a wafer and spun with a rotational speed that determines the SOG thickness. The film is then cured at a temperature of approximately 400° C. and typically etched back to a smooth surface in preparation for a capping oxide film on which a second inter-level metal can be patterned. The capping oxide layer is desirable for sealing and protecting the SOG layer during further processing.

Figure 5B:
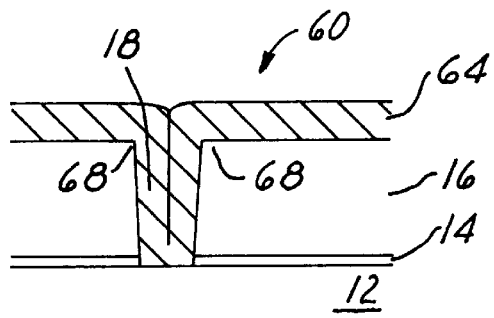
FIG. 5B is an enlarged, cross-sectional view of the contact shown in FIG. 4 after reflow and deposited with tungsten by a chemical vapor deposition method.

Referring now to FIG. 5B in which a contact opening 18 in a semiconductor structure 60 filled with a tungsten metal layer 64 is shown. It should be noted that in FIG. 5B, the reflow process of the dielectric layer 16 is carried out in a different, or in an alternate embodiment of the present invention. In this alternate embodiment, tungsten metal is deposited into contact opening 18 by a chemical vapor deposition process. The doped dielectric layer 16 is then annealed by a process that is different than that carried out in the preferred embodiment for aluminum filling.

In general, contact openings are filled with an appropriate conducting material such as aluminum or tungsten, to form vertical connections to a first level metal. The metal fill should provide a void-free stud and exhibit low contact resistance to underlaying and overlaying conductors. Tungsten CVD process has been used for contact hole filling in forming via plugs or contact studs. It is typically carried out by a pyrolitic decomposition of tungsten hexafluoride ($WF_6$), or by a reduction of $WF_6$ with hydrogen, silicon or silane. A typical pyrolitic decomposition process can be carried out at a temperature near 800° C. and resulting in the formation of tungsten and fluorine gas. Since chemical vapor deposition technique provides more uniform step coverage and more efficient contact hole filling than either an evaporation or a sputtering process, the CVD method is widely used to deposit tungsten. Due to the fact that no sputtering is involved in such deposition, sharp corners 68 at the shoulder portion of the contact opening 18 (shown in FIG. 5B) can be tolerated in a tungsten CVD deposition process. This is in contrast to that shown in FIG. 2, where sharp corners 24 must be eliminated and reflowed into rounded corners (FIG. 3) 34 during the reflow process for the dielectric layer 16.

In the alternate embodiment of the present invention, it is therefore possible to use a thicker cap oxide layer (not shown in FIG. 5B) than that used in the preferred embodiment (for aluminum sputtering) in coating the contact opening 18 and blocking dopant ion diffusions. For instance, when depositing tungsten by a chemical vapor deposition technique, a cap oxide layer having a thickness between about 300 Å and about 600 Å can be used to stop dopant ions of boron and phosphor in the BPSG dielectric layer from diffusing into contact opening 18. The thick cap oxide layer prevents the sharp corner 68 in contact opening 18 from flowing and thus the sharp corner is maintained after the reflow process of the dielectric layer 16. However, the sharp corner does not affect the tungsten CVD process due to the superior step coverage and contact hole filling capabilities of the process.

It should be noted that, as previously described in the preferred embodiment of the present invention where aluminum deposition by a sputtering process is utilized to fill the contact opening, only a thin layer of cap oxide material, i.e., between about 50 Å and about 300 Å should be used in the contact opening to prevent dopant ion diffusion while allowing the dielectric layer to reflow to produce a rounded corner in the opening. To the contrary, as shown in the alternate embodiment of tungsten deposition by a CVD process, a substantially thicker layer of cap oxide, i.e., between about 300 Å and about 600 Å can be coated in the contact opening to prevent dopant ion diffusion during a high temperature reflow process for the dielectric layer. The thick cap oxide layer prevents the dielectric material at corner 68 (shown in FIG. 5B) from flowing and thus a sharp corner is maintained after the reflow process.

Figure 8:
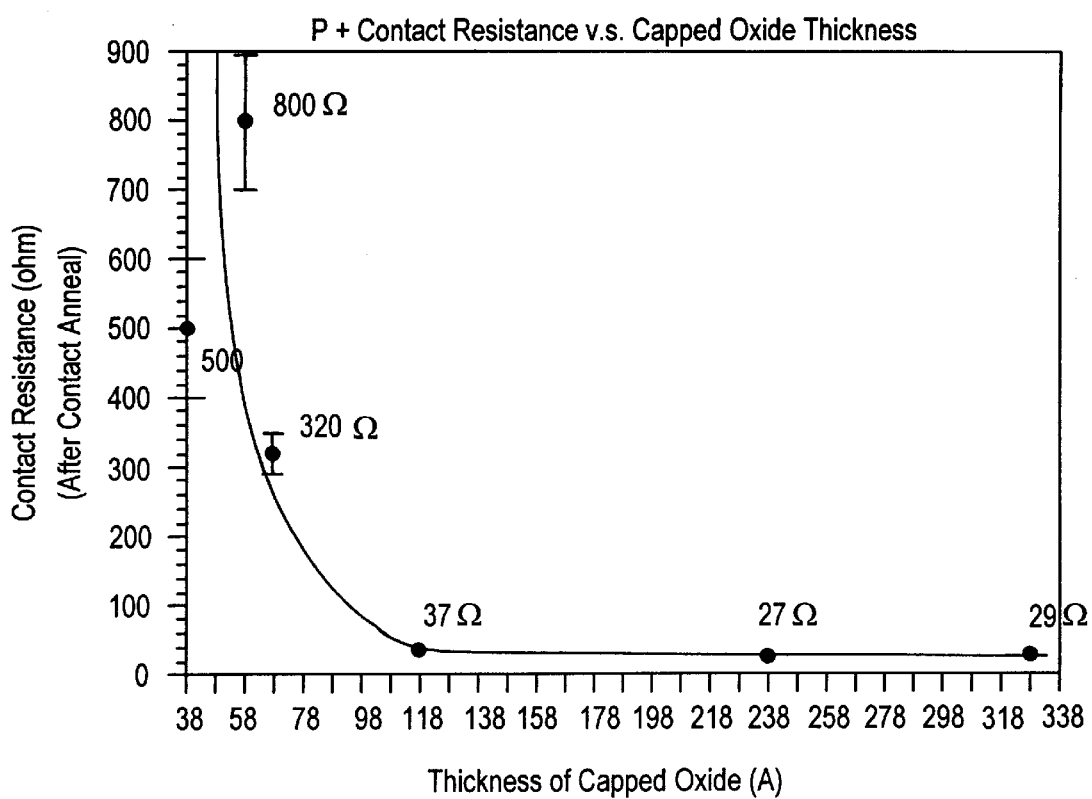
FIG. 8 is a graph illustrating the dependency of contact resistance after anneal on the thickness of the cap oxide layer.

FIG. 8 is a graph illustrating the dependency of contact resistance (after contact anneal) on the thickness of cap oxide layer deposited into a contact opening. It is seen that the contact resistance decreases rapidly in a thickness range of the cap oxide layer up to approximately 110 Å. At thicknesses larger than 110 Å, contact resistance remains substantially constant up to a thickness as high as 320 Å. The effectiveness of the present invention novel method of using a cap oxide layer in preventing dopant ion diffusion and causing instability in the contact resistance value is amply demonstrated by this graph.

The advantages made possible by the present invention method of contact annealing in a doped dielectric layer without the occurrence of dopant ion diffusion problem are therefore amply illustrated by the above preferred and the alternate embodiment of the invention.

While the present invention has been described in an illustrative manner, it should be understood that the terminology used is intended to be in a nature of words of description rather than of limitation.

Furthermore, while the present invention has been described in terms of a preferred and an alternate embodiments, it is to be appreciated that those skilled in the art will readily apply these teachings to other possible variations of the inventions.

The embodiment of the invention in which an exclusive property or privilege is claimed are defined as follows:

1. A method for contact anneal in a doped dielectric layer without the occurrence of dopant diffusion problem comprising the steps of:

providing a semi-conducting substrate, forming a first dielectric layer on said substrate, depositing a second dielectric layer on said first dielectric layer, said second dielectric layer containing at least one type of dopant ion and is substantially thicker than said first dielectric layer, forming a contact opening in said first and said second dielectric layers, depositing a cap layer of plasma enhanced TEOS-ozone having a thickness sufficiently small so as not to impede the flow of said second dielectric layer particularly at corner area of said contact opening, and annealing said contact at a temperature sufficient to reflow said second dielectric layer.

2. A method according to claim 1, wherein said first dielectric layer formed on said substrate is an oxide layer or a silicon nitride layer.

3. A method according to claim 1, wherein said second dielectric layer is formed of boro-phospho-silicate glass (BPSG) material.

4. A method according to claim 1, wherein said third dielectric layer has a thickness of not less than 50 Å.

5. A method according to claim 1 further comprising the steps of:

removing said third dielectric layer, and depositing an electrically conductive material in said contact.

6. A method according to claim 5, wherein said electrically conducting material is aluminum deposited by a sputtering method.

7. A method according to claim 5, wherein said electrically conducting material is tungsten deposited by a chemical vapor deposition method.

8. A method according to claim 1, wherein said annealing temperature for said contact is at least 700° C.

9. A method for annealing a contact formed in a doped dielectric layer without the occurrence of dopant contamination problem comprising the steps of:

providing a silicon substrate, forming a first dielectric layer on said silicon substrate, depositing a second dielectric layer having a substantially larger thickness than and on said first dielectric layer, said second dielectric layer containing at least one type of dopant ions, forming a contact opening in said first and said second dielectric layers, depositing a cap layer of plasma enhanced TEOS-ozone oxide having a thickness sufficiently small so as not to impede the flow of said second dielectric layer particularly at corner area of said contact opening, and annealing said contact at a temperature sufficient to reflow said second dielectric layer.

10. A method according to claim 9, wherein said first dielectric layer is formed of a tetra-ethoxy-silicate (TEOS oxide) material.

11. A method according to claim 9, wherein said second dielectric layer is formed of a silicate glass comprising dopant ions of boron.

12. A method according to claim 9, wherein said second dielectric layer is formed of a boro-phospho-silicate (BPSG) glass.

13. A method according to claim 9, wherein said cap layer has a thickness of not less than 50 Å.

14. A method according to claim 9, wherein said cap layer has a thickness between about 50 Å and about 600 Å, and preferably between about 100 Å and about 300 Å.

* * * * *